(12) United States Patent
Zhou

(10) Patent No.: US 11,536,887 B2
(45) Date of Patent: Dec. 27, 2022

(54) POLARIZING COMPONENT AND DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventor: Weilong Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 548 days.

(21) Appl. No.: 16/631,828

(22) PCT Filed: Aug. 15, 2019

(86) PCT No.: PCT/CN2019/100723
§ 371 (c)(1),
(2) Date: Jan. 16, 2020

(87) PCT Pub. No.: WO2020/038270
PCT Pub. Date: Feb. 27, 2020

(65) Prior Publication Data
US 2021/0223452 A1    Jul. 22, 2021

(30) Foreign Application Priority Data
Aug. 24, 2018 (CN) .......................... 201810975395.5

(51) Int. Cl.
*G02B 5/30* (2006.01)
*G02F 1/1335* (2006.01)
(Continued)

(52) U.S. Cl.
CPC .......... *G02B 5/3083* (2013.01); *G02B 5/305* (2013.01); *G02F 1/13363* (2013.01);
(Continued)

(58) Field of Classification Search
CPC .... G02B 5/3083; G02B 5/305; G02B 27/286; G02F 1/133528; G02F 1/13363;
(Continued)

(56) References Cited

U.S. PATENT DOCUMENTS

2001/0013971 A1* 8/2001 Kleinberger ........... H04N 13/38
348/E13.058
2005/0151896 A1* 7/2005 Hara .................... G02B 5/3016
349/96
(Continued)

FOREIGN PATENT DOCUMENTS

CN    101593769 A    12/2009
CN    101943800 A    1/2011
(Continued)

OTHER PUBLICATIONS

First Chinese Office Action dated Jan. 3, 2020, received for corresponding Chinese Application No. 201810975395.5, 11 pages.

*Primary Examiner* — Sophie Hon
(74) *Attorney, Agent, or Firm* — Kinney & Lange, P.A.

(57) ABSTRACT

A polarizing component and a display panel are provided in embodiments of the disclosure, the polarizing component comprising: a first polarizer on a light-incident side thereof, and configured to polarize a light incident thereon into a first linearly polarized light; a wave plate layer on a surface of the first polarizer facing away from the light-incident side; and a second polarizer on a surface of the wave plate layer facing away from the light-incident side, on a light-emergent side opposite to the light-incident side, and configured to polarize a light incident thereon into a second linearly polarized light;
(Continued)

the wave plate layer comprises a phase delay portion configured to delay a phase of the first linearly polarized light incident thereon in a direction different from a direction of an optical axis of the phase delay portion such that a polarized light exiting the phase delay portion comprises a first polarized light in a first polarization direction and a second polarized light in a second polarization direction, without incurring any phase delay of the first linearly polarized light incident on the phase delay portion in a direction consistent with the direction of the optical axis of the phase delay portion.

14 Claims, 4 Drawing Sheets

(51) Int. Cl.
  *G02F 1/13363* (2006.01)
  *H01L 27/32* (2006.01)
  *H01L 51/52* (2006.01)

(52) U.S. Cl.
  CPC .. *G02F 1/133531* (2021.01); *G02F 1/133541* (2021.01); *G02F 1/133638* (2021.01); *H01L 27/3218* (2013.01); *H01L 51/5293* (2013.01); *C09K 2323/03* (2020.08)

(58) Field of Classification Search
  CPC ......... G02F 1/133638; G02F 1/133631; G02F 2413/01; H01L 51/5293; C09K 2323/03–035
  See application file for complete search history.

(56) References Cited

U.S. PATENT DOCUMENTS

| | | | |
|---|---|---|---|
| 2006/0126156 A1* | 6/2006 | Evans | G02F 1/13363 359/320 |
| 2008/0094528 A1 | 4/2008 | Robinson et al. | |
| 2009/0296366 A1* | 12/2009 | Shikina | H01L 51/5262 362/19 |
| 2011/0002039 A1 | 1/2011 | Seo et al. | |
| 2012/0217529 A1 | 8/2012 | Katayama | |
| 2013/0001600 A1 | 1/2013 | Lim et al. | |
| 2017/0131593 A1 | 5/2017 | Tang | |
| 2018/0217441 A1 | 8/2018 | Pan | |

FOREIGN PATENT DOCUMENTS

| | | |
|---|---|---|
| CN | 102576791 A | 7/2012 |
| CN | 102856341 A | 1/2013 |
| CN | 105242342 A | 1/2016 |
| CN | 106443858 A | 2/2017 |
| CN | 207517695 U | 6/2018 |
| CN | 109065600 A | 12/2018 |
| CN | 109065600 B * | 7/2020 |

* cited by examiner

POLARIZING COMPONENT AND DISPLAY PANEL

CROSS-REFERENCE TO RELATED APPLICATION(S)

This application is a Section 371 National Stage Application of International Application No. PCT/CN2019/100723, filed on Aug. 15, 2019, entitled "POLARIZING COMPONENT AND DISPLAY PANEL", which claims priority to Chinese Patent Application Invention No. 201810975395.5 filed on Aug. 24, 2018 in the China National Intellectual Property Administration, the whole disclosure of which is incorporated herein by reference.

BACKGROUND OF THE DISCLOSURE

Field of the Disclosure

Embodiments of the present disclosure generally relate to the technical field of display technology, and in particular, to a polarizing component and a display panel.

Description of the Related Art

With a rapid development of display technologies, although display panels of relevant art may be developed to meet personalized demands of users, for example, a phenomenon of color deviation of white pictures viewed at different viewing angles may appear simultaneously.

SUMMARY OF THE DISCLOSURE

The embodiments of the present disclosure have been made to overcome or alleviate at least one aspect of the above mentioned disadvantages and/or shortcomings in the prior art, by providing a polarizing component and a display panel.

Following technical solutions are adopted in exemplary embodiments of the disclosure.

According to one aspect of embodiments of the disclosure, there is provided a polarizing component, comprising: a first polarizer provided on a light-incident side of the polarizing component, and configured to polarize a light incident thereon into a first linearly polarized light; a wave plate layer on a surface of the first polarizer facing away from the light-incident side; and a second polarizer provided on a surface of the wave plate layer facing away from the light-incident side, on a light-emergent side opposite to the light-incident side of the polarizing component, and configured to polarize a light incident thereon into a second linearly polarized light; the wave plate layer comprises a phase delay portion configured to delay a phase of the first linearly polarized light which is incident thereon in a direction different from a direction of an optical axis of the phase delay portion in such a way that a polarized light which exits the phase delay portion comprises a first polarized light in a first polarization direction and a second polarized light in a second polarization direction, without incurring any phase delay of the first linearly polarized light which is incident on the phase delay portion in a direction consistent with the direction of the optical axis of the phase delay portion.

According to embodiments of the disclosure, the wave plate layer further comprises a light transmission portion provided on a same layer as the phase delay portion, and both the light transmission portion and the phase delay portion are provided side by side between the first polarizer and the second polarizer and have an identical thickness, and the light transmission portion is configured to transmit the first linearly polarized light which is incident thereon.

According to embodiments of the disclosure, the phase delay portion is a quarter wave plate.

According to embodiments of the disclosure, the light transmission portion is arranged in an array, and the phase delay portion is also arranged in an array, and the light transmission portion and the phase delay portion are provided to be staggered with each other.

According to embodiments of the disclosure, the wave plate layer comprises a cross-linked azobenzene polymer film layer, and the phase delay portion is a patterned region in the cross-linked azobenzene polymer film layer, which patterned region is in a form of crystallization after being irradiated by linearly polarized light.

According to embodiments of the disclosure, the first polarized light has a first light intensity, the second polarized light has a second light intensity, and the first light intensity and the second light intensity are superposed to be a light intensity of the first polarized light.

According to embodiments of the disclosure, the optical axis of the phase delay portion is perpendicular to the wave plate layer.

According to embodiments of the disclosure, the first polarized light and the second polarized light have one and the same polarization direction.

According to embodiments of the disclosure, the polarized light which exits the phase delay portion comprises an elliptically polarized light or a circularly polarized light.

According to embodiments of the disclosure, the wave plate layer has a thickness ranging between 0.5 μm and 10 μm.

According to embodiments of the disclosure, the phase delay portion comprises at least a plurality of first units arranged in an array and a plurality of second units arranged in an array, the plurality of first units are configured to implement a first phase delay onto the linearly polarized light incident thereon and the plurality of second units are configured to implement a second phase delay onto the linearly polarized light incident thereon, respectively, and the first phase delay is different from the second phase delay.

According to another aspect of the exemplary embodiment of the present disclosure, there is provided a display panel, comprising: display components, and the polarizing component as above, which is located on a light-emergent side of the display components, the display components are located on a side of the polarizing component proximal to the first polarizer.

According to embodiments of the disclosure, the display component comprises a plurality of first sub-pixels, light emitted by the plurality of first sub-pixels passing through the first polarizer to form the first linearly polarized light of the plurality of first sub-pixels; the phase delay portion includes a plurality of first units located at a light-emergent side of the plurality of the first sub-pixels in the display panel, with orthogonal projections of the plurality of first units on a surface of the display panel at the light-emergent side thereof at least partially overlapping with regions on the surface of the display panel at the light-emergent side thereof which are occupied by the plurality of first sub-pixels, and the plurality of first units are configured to implement a first phase delay onto the first linearly polarized light of the plurality of first sub-pixels which is incident thereon in a direction different from a direction of an optical axis of the plurality of first units.

According to embodiments of the disclosure, the display component further comprises a plurality of second sub-pixels having a color different from that of the plurality of first sub-pixels, light emitted by the plurality of second sub-pixels passing through the first polarizer to form the first linearly polarized light of the plurality of second sub-pixels; the phase delay portion further comprises a plurality of second units located at a light-emergent side of the plurality of the second sub-pixels in the display panel, with orthogonal projections of the plurality of second units on a surface of the display panel at the light-emergent side thereof at least partially overlapping with regions on the surface of the display panel at the light-emergent side thereof which are occupied by the plurality of second sub-pixels, and the plurality of second units are configured to implement a second phase delay onto the first linearly polarized light of the plurality of second sub-pixels which is incident thereon in a direction different from a direction of an optical axis of the plurality of second units, with the second phase delay being different from the first phase delay.

According to embodiments of the disclosure, orthogonal projections of the plurality of first sub-pixels on a plane where the display component is located falls within orthogonal projections of the plurality of first units on the plane where the display component is located, and orthogonal projections of the plurality of second sub-pixels on the plane where the display component is located falls within orthogonal projections of the plurality of second units on the plane where the display component is located.

According to embodiments of the disclosure, the display component is an OLED device or an LCD device.

BRIEF DESCRIPTION OF THE DRAWINGS

The drawings are used to provide a further understanding of the technical scheme of the present disclosure embodiments and form part of the specification. The drawings, together with the embodiments of the present application, are used to explain the technical solution of the present disclosure embodiments, but fail to constitute a limitation on the technical solution of the present disclosure embodiments.

DETAILED DESCRIPTION

Figure 1:
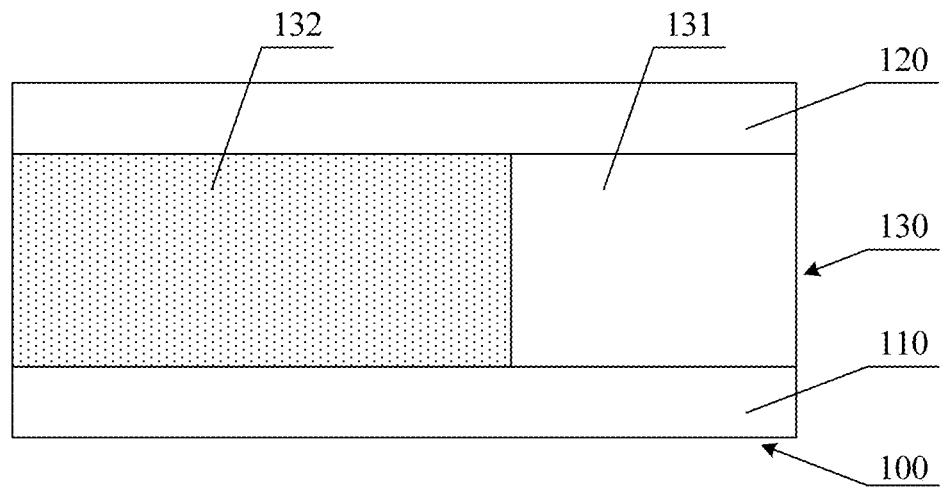
FIG. 1 illustrates a schematic structural view of a polarizing component according to embodiments of the disclosure.

Embodiments of the present disclosure will be described in detail below with reference to the accompanying drawings in order to make purposes, technical solutions and advantages of the present disclosure more clear. It should be noted that features in various embodiments of the present disclosure may be arbitrarily combined with each other without conflict.

Steps illustrated in flowcharts of the drawings may be executed in a computer system in which a set of computer may for example execute instructions. Also, although logical sequences are illustrated in the flowcharts, in some cases the steps shown or described may be performed in an order which is different from that described herein.

Following specific embodiments of the present disclosure can be combined with each other or one another, and the same or similar concepts or processes may not be described in some embodiments.

In addition, in the following detailed description, for the convenience of explanation, many specific details are set forth to provide a comprehensive understanding of the present disclosure embodiment. However, it is apparent that, one or more embodiments are also implemented, for example, without these specific details. In other cases, well-known structures and devices are illustrated to simplify the accompanying drawings.

Dimensions and shapes of components in the drawings only intend to illustrate the content of the present disclosure, rather than reflecting true scale of the polarizing component and the display panel according to the embodiment of the present disclosure.

A color deviation or color offset of an OLED (organic light emitting diode) panel in relevant art may for example be improved by adjusting a thickness of each of cathodes and weakening a micro-cavity effect, which also results in a decrease in front efficiency and an increase in cathode resistance. In addition, the color deviation or color offset of the OLED panel may also be improved by adjusting specific positions of the micro-cavity enhanced band, and simultaneously reduce a color gamut of the displayed pictures. Therefore, it is necessary to improve the color deviation of the OLED panel at different viewing angles without influencing the front efficiency, the cathode resistance and the color gamut of displayed pictures of an OLED panel.

FIG. 1 illustrates a schematic structural view of a polarizing component according to embodiments of the disclosure. In an aspect of embodiments of the disclosure, according to a general technical concept of embodiments of the disclosure, a polarizing component 100 is provided, comprising: a first polarizer 110 and a wave plate layer 130 provided on a surface of the first polarizer 110 at a side thereof (i.e., a surface of the first polarizer 110 facing away from a light-incident side), and a second polarizer 120 provided on a surface of the wave plate layer 130 at a side thereof facing away from the first polarizer 110 (i.e., a surface of the wave plate layer facing away from the light-incident side), on a light-emergent side opposite to the light-incident side of the polarizing component. In other words, the polarizing component comprises the first polarizer 110 provided on a first side (e.g., the light-incident side) of the polarizing component 100 and the second polarizer 120 provided on a second side (e.g., the light-emergent side) of the polarizing component 100 which side is opposite to the first side, and the wave plate layer 130 provided between the first polarizer 110 and the second polarizer 120.

The first polarizer 110 is configured to polarize a light incident thereon into a first linearly polarized light, and the second polarizer 120 is configured to polarize a light incident thereon into a second linearly polarized light.

The wave plate layer 130 may comprise a phase delay portion 132 which is configured to delay a phase of the first linearly polarized light (i.e., to implement a phase delay onto the first linearly polarized light) which is incident thereon in a direction different from a direction of an optical axis of the phase delay portion 132 in such a way that a polarized light which exits the phase delay portion comprises a first polarized light in a first polarization direction and a second polarized light in a second polarization direction (for example, the first polarization direction is perpendicular to the second polarization direction). The phase delay portion 132 may not incur any phase delay of the first linearly polarized light which is incident on the phase delay portion in a direction consistent with the direction of the optical axis of the phase delay portion 132.

In some embodiments of the disclosure, the wave plate layer 130 further comprises a light transmission portion 131 which may be provided on a same layer as the phase delay portion. As used herein, an expression "provided on a same layer as" refers to a relationship between the layers simultaneously formed in one and the same step. The term "same layer" refers to a relationship between the layers simultaneously formed in the same step. The term "same layer" does not always mean that a height or a thickness of the layers in a cross-sectional view is the same. Meanwhile, as illustrated, both the light transmission portion 131 and the phase delay portion 132 are provided side by side between the first polarizer 110 and the second polarizer 120 and have an identical thickness. The light transmission portion 131 of the wave plate layer 130 is configured to transmit light incident thereon, for example, to transmit the first linearly polarized light which comes from the first polarizer and is then incident thereon.

Figure 2:
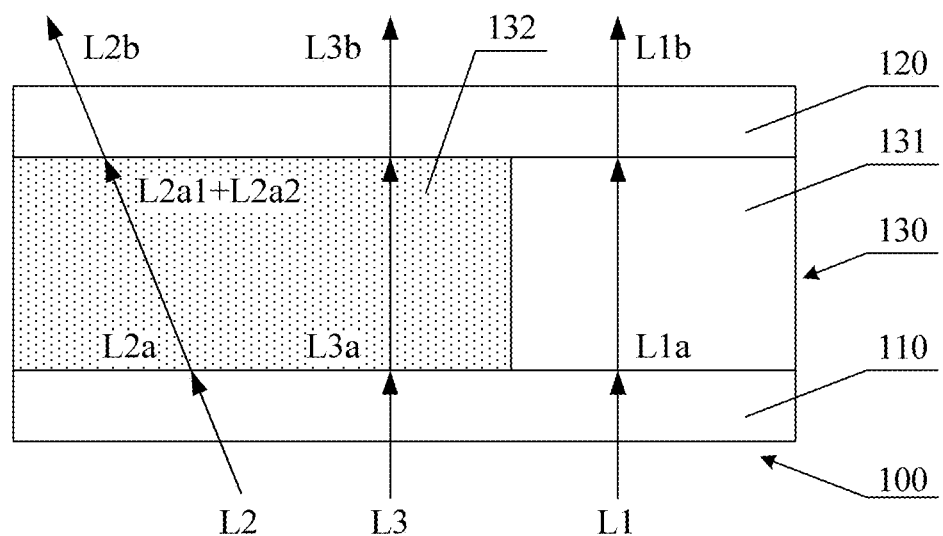
FIG. 2 illustrates a schematic view of an optical effect of the polarizing component as illustrated in FIG. 1.

The polarizing component 100 according to embodiments of the disclosure realizes an effect of reducing a light intensity of a polarized light by using the wave plate layer 130 provided between the first polarizer 110 and the second polarizer 120 (more specifically, an effect of reducing the light intensity of the polarized light is realized by using the phase delay portion in the wave plate layer 130). Based on an optical principle of a polarizer, that is, a polarizer has a light distribution/dispensing function of transmitting and absorbing a light incident thereon, then, the polarizer may transmit linearly polarized light in a specified polarization direction and absorb other polarized light in other polarization directions different from the specified polarization direction. In the embodiments of the present disclosure, within the polarizing component 100, an optical effect of light rays incident onto the polarizing component 100 may be divided into three stages. FIG. 2 illustrates a schematic view of an optical effect of the polarizing component as illustrated in FIG. 1. Following three stages are illustrated by taking a case in which the first polarized light and the second polarized light have one and the same polarization direction as an example.

First stage: that is, a stage in which an incident light L1 propagates in the first polarizer 110 and is in turn incident on the wave plate layer 130 through a polarization effect of the first polarizer 110.

After the incident light L1 passes through the first polarizer 110, due to the polarization effect of the first polarizer 110, an emergent light exiting the first polarizer 110 is a first linearly polarized light L1a in the specified polarization direction. The first linearly polarized light which exits the first polarizer is set as the linearly polarized light L1a in a polarization direction labeled by α. The linearly polarized light L1a is incident on and enters the wave plate layer 130.

Moreover, an incident light L2 is incident in a direction that is not perpendicular to the first polarizer 110, and in turn becomes a linearly polarized light L2a after being subjected to the polarization effect of the first polarizer 110, and then propagates towards and exits the phase delay section 132 in the wave plate layer 130.

Moreover, an incident light L3 is incident in a direction perpendicular to the first polarizer 110, and in turn becomes a linearly polarized light L3a after being subjected to the polarization effect of the first polarizer 110, and continues to propagate towards and exits the phase delay portion 132 in a direction perpendicular to the phase delay portion 132 in the wave plate layer 130.

The wave plate layer 130 in embodiments of the present disclosure comprises the light transmission portion 131 and a phase delay portion 132 arranged in one and the same layer between the first polarizer 110 and the second polarizer 120, and having different optical effects on the incident light.

The second stage: that is, a stage in which the linearly polarized light coming from the first polarizer 110 propagates in the wave plate layer 130.

On the one hand, the light transmission portion 131 has no effect of decomposing the polarization direction and phase delay and the like on the light incident thereon. The incident light exits in a direction in which it is incident on and enters the light transmission portion originally. And as to the linearly polarized light which is incident on and enters the light transmission portion 131 and has its polarization direction α (i.e., the linearly polarized light L1a), after it passes through the light transmission portion 131, it produces an emergent light which essentially remains the same as the linearly polarized light L1a as originally entering the light transmission portion.

On the other hand, the phase delay portion 132 has its effect of decomposing the polarization direction and phase delay on the linearly polarized light incident thereon. By way of example, the phase delay portion 132 may equivalently set to be a quarter wave plate. In order to facilitate an interpretation of the optical effect of the phase delay portion 132, the optical principle of the wave plate is briefly introduced as follows: the wave plate is an optical device which is capable of generating an additional optical path difference between two types of optical vibrations perpendicular to each other. By taking a case in which the linearly polarized light is incident on the wave plate in a direction perpendicular to the wave plate with an angle θ between a vibration direction of the linearly polarized light and an optical axis of the wave plate being not equal to zero as an example, since the incident linearly polarized light is incident on and enters the quarter wave plate in a direction different from the direction of the optical axis of the phase delay portion and in turn results in a birefringence, then, the polarization direction of the linearly polarized light incident on the wave plate is divided into two components, one being perpendicular to the optical axis of the wave plate (vibration 'o') and the other being parallel to the optical axis of the wave plate (vibration 'e'); in other words, the polarization direction of linearly polarized light in the wave plate comprises a polarization direction 'o' and a polarization direction 'e' (i.e., they are referred to as two types of light comprising: an ordinaire light or light 'o', which follows the law of refraction and propagating at one and the same speed and having one and the same refractive index in all directions, and an extra-ordinaire light or light 'e', which fails to follow the law of refraction and propagating at different speeds and having different refractive index in various directions, respectively). The light 'o' and the light 'e' propagate at different speeds in one and the same direction, resulting in an optical path difference between the light 'o' and the light 'e' after both exiting the wave plate. The optical path difference is $(n_o-n_e)*d$, where d is a thickness of the wave plate, $n_o$ is a refractive index of the light 'o' and $n_e$ is a refractive index of the light 'e', and thus a difference in phase delay between the light 'o' exiting the wave plate and the light 'e' exiting the wave plate $\Delta_j$ can be expressed as below:

$$\Delta_j=2\pi*(n_o-n_e)*d/k;$$

In practical applications, the difference in phase delay of the quarter wave plate $\Delta_j$ is expressed as:

$$\Delta_j=2\pi*(n_o-n_e)*d/\lambda=\pi*(2m+1)/2, \quad \text{where} \quad M=0, \pm1, \pm2, \ldots;$$

Where the parameter $\lambda$ is a wavelength of the linearly polarized light, which is incident on the quarter wave plate.

It can be seen that, once the linearly polarized light passes through the quarter wave plate, the light exiting the quarter wave plate in both the polarization direction 'o' and the polarization direction 'e' form/compose collectively an elliptically polarized light or a circularly polarized light. In a condition that θ is 45°, the light exiting the wave plate is circularly polarized light.

Based on the optical principle of the wave plate, in some embodiments, the first linearly polarized light which is incident on and enters the phase delay portion 132 in the wave plate layer 130 in a direction different from the direction of the optical axis of the phase delay portion 132, may for example be formed by the incident light L2 as illustrated in FIG. 2 which is incident on and enters the first polarizer 110 in a direction non-perpendicular to the first polarizer 110 and in turn becomes the linearly polarized light L2a to exit after being subjected to the polarization effect of the first polarizer 110. The linearly polarized light L2a is incident on and enters the phase delay portion 132 in a direction at an angle relative to the direction of the optical axis of the phase delay portion 132 (as illustrated in FIG. 2, a case in which the direction of the optical axis of the phase delay portion 132 is perpendicular to the wave plate layer 130 is taken as an example); in other words, the linearly polarized light L2a is incident onto and enters the phase delay portion 132 in a direction other than the direction of the optical axis of the phase delay portion 132. Within the phase delay portion 132, the linearly polarized light L2a is decomposed/divided into a first polarized light L2a1 in the first polarization direction and a second polarized light L2a2 in the second polarization direction. Generally speaking, the polarized light L2a1 and the polarized light L2a2 are synthesized or combined to be elliptically polarized light. In a condition that the linearly polarized light L2a which is incident is at an angle of 45° with reference to the optical axis of the phase delay portion 132, the polarized light L2a1 and the polarized light L2a2 are synthesized or combined to be circularly polarized light. And in some embodiments, the first polarized light L2a1 has a first light intensity, the second polarized light L2a2 has a second light intensity, and the first light intensity and the second light intensity are superposed to be the light intensity of the first linearly polarized light L2 which is incident on the phase delay portion.

In a special condition, for the linearly polarized light which is incident onto and enters the phase delay portion 132 in the wave plate layer 130 in the direction the same as that of the optical axis of the phase delay portion 132, the phase delay portion 132 has no effect of decomposing the polarization direction and phase delay on this type of the linearly polarized light, e.g., the incident light L3 as illustrated in FIG. 2. The incident light L3 is incident on and enters the first polarizer 110 in a direction perpendicular to the first polarizer, and in turn becomes the linearly polarized light L3a to exit after being subjected to the polarization effect of the first polarizer 110. The linearly polarized light L3a is incident on and enters the phase delay portion 132 perpendicularly thereto, i.e., the linearly polarized light L3a is incident in a direction the same as that of the optical axis of the phase delay portion 132. Therefore, there is no change in the polarization direction of the linearly polarized light L3a after passing through the phase delay portion 132 perpendicularly thereto, and it produces an emergent light which essentially remains the same as the linearly polarized light L3a as originally entering the phase delay portion 132.

The third stage: that is, a stage in which the polarized light coming from the light transmission portion 131 of the wave plate layer 130 propagates in the second polarizer 120 and exits after being subjected to the polarization effect of the second polarizer 120.

On the one hand, the linearly polarized light L1a, which is produced by the incident light L1 passing through the light transmission portion 131 of the wave plate layer 130 and exiting, is incident on and enter the second polarizer 120. A light transmission axis of the second polarizer 120 is in the same direction as a direction of a light transmission axis of the first polarizer 110, and is also used for transmitting the linearly polarized light having a polarization direction a. That is to say, the linearly polarized light L1a passes through the second polarizer 120 and then becomes a linearly polarized light L1b which exits the second polarizer 120 and has an light intensity essentially the same as that of the linearly polarized light L1a which is incident originally.

On the other hand, the linearly polarized light L3a which exits the phase delay portion 132 of the wave plate layer 130 in a direction perpendicular thereto, i.e., the linearly polarized light L3a formed by the incident light L3 which is incident onto and enters the phase delay portion 132 in a direction perpendicular thereto as illustrated in FIG. 2, is then incident on and enters the second polarizer 120, and in turn passes through the second polarizer 120 so as to produce a linearly polarized light L3b which exits there and has an light intensity essentially remaining the same as that of the linearly polarized light L3a which is incident originally.

In addition, as to the linearly polarized light L2a which is incident on and enters the phase delay portion 132 at an angle rather than perpendicular thereto, it produces a linearly polarized light exiting the phase delay portion 132 comprising the polarized light L2a1 and the polarized light L2a2. The polarized light L2a1 and the polarized light L2a2 are also incident on and enter the second polarizer at an angle rather than perpendicular thereto; in other words, they are incident in a direction at an angle with reference to the light transmission axis of the second polarizer 120. The polarized light L2a1 and the polarized light L2a2 (both of which are considered to be synthesized or combined into an elliptically polarized light or a circularly polarized light) become a linearly polarized light L2b after passing through the second polarizer 120, and then the linearly polarized light L2b exiting the second polarizer 120 has a polarization direction essentially maintaining the same as the polarization direction a of the linearly polarized light L2a. And the linearly polarized light L2b is not exactly the linearly polarized light L2a which is incident on and enters the phase delay portion 132; essentially, the polarization direction of the linearly polarized light L2*b* exiting the second polarizer 120 is just consistent with the polarization direction a of the linearly polarized light L2*a* which is incident on and enters the phase delay portion 132.

It should be noted that, during an actual propagation process of the light propagating within the phase delay portion 132 functioning as a polarization region, the light which is incident on and enters the polarization region 132 in a direction rather than the direction of the optical axis of the phase delay portion 132 essentially results in a birefringence. By taking a condition in which a section containing both the incident light and the optical axis as an example, the section is a referred to as a principal section. The incident light is decomposed into the light 'o' and the light 'e' as mentioned above, in the principal section; the light 'o' follows the law of refraction and passes through the phase delay portion 132 perpendicularly thereto, with its polarization direction being perpendicular to the principal section, while the light 'e' fails to follow the law of refraction and exits by deviating from the light 'o', with its polarization direction being parallel to the principal section. Therefore, the polarization direction α of the linearly polarized light L2*a* is not necessarily a synthesized polarization direction of both the linearly polarized light L2*a*1 and the linearly polarized light L2*a*2, but the polarization direction of the linearly polarized light L2*b* exiting the second polarizer 120 is consistent with the polarization direction α of the linearly polarized light L2*a*. In addition, since the second polarizer 120 absorbs other polarized light having polarization direction(s) different from the polarization direction a of the linearly polarized light L2*a*, then, the linearly polarized light L2*b* exiting the second polarizer 120 has its light intensity smaller than that of the polarized light which is incident on and enters the second polarizer (i.e., the polarized light L2*a*1 and the polarized light L2*a*2). In other words, the phase delay portion 132 may decrease the light intensity of the linearly polarized light L2*a* which is incident on and enters the phase delay portion in a direction different from the direction of the optical axis of the phase delay portion. Since most of the linearly polarized light L2*a* which is incident on and enters the phase delay portion 132 in directions different from the direction of the optical axis of the phase delay portion, then, the phase delay portion 132 has a relatively superior effect of decreasing the light intensity of the linearly polarized light L2*a*.

Figure 3:
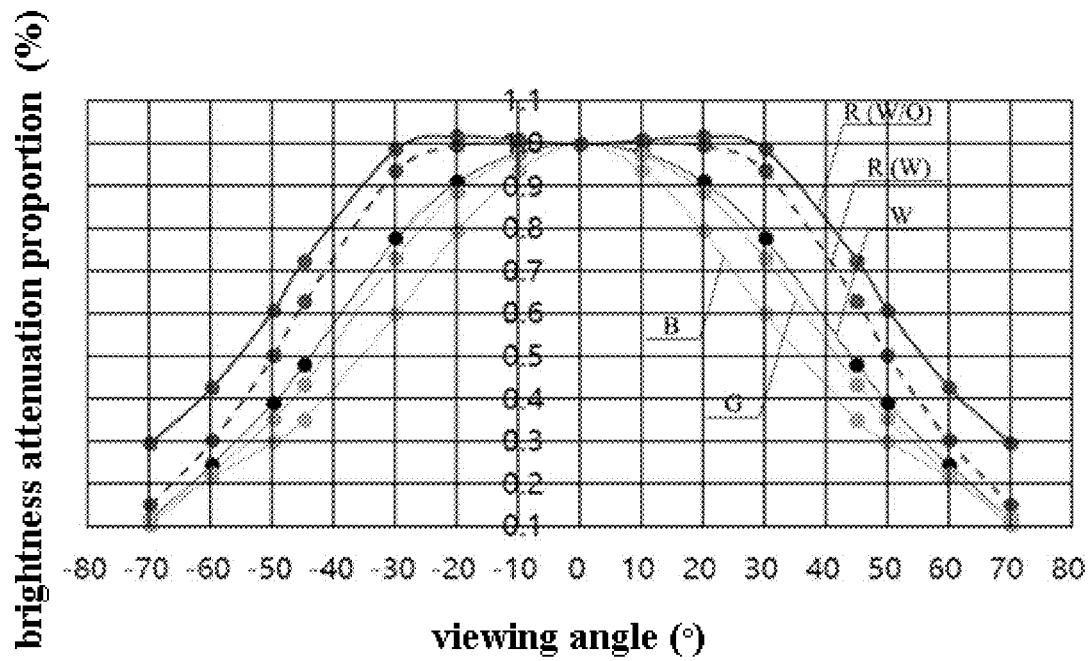
FIG. 3 illustrates various curves in each of which a brightness of respective color of the display panel decreases with a variation of a viewing angle.

A color deviation or color offset phenomenon may occur in a display panel in the relevant art on the basis of a principle, lying in that the display panel may typically comprise sub-pixels of different colors. By way of example, white light may comprise red, green and blue (abbreviated as R, G, B) color light components, thereby irradiating respective red, blue and green sub-pixels. When a user changes the viewing angle thereof, a ratio of brightness or luminance among red, green, and blue color light components to be used for lighting the R, G, the B sub-pixels by irradiation thereon changes accordingly, and specific color of the white light changes subsequently so as to produce a chromaticity distortion or deviation, i.e., the color deviation or color offset as mentioned above. In practical application, in a condition that the brightness of the R sub-pixels is larger than that of each type of the G sub-pixels and the B sub-pixels (the brightness of sub-pixels here refers to a brightness of a light exiting the sub-pixels), white pictures will turn more or less (i.e., somewhat) towards red, that is to say, there may occur the color deviation or color offset. As to an OLED panel, since a micro-cavity effect exists in a top-emission device, then, a curve in which the brightness decreases with an increase in the viewing angle (i.e., a Luminance Decay Curve) may no longer follow Lambertian body distribution; that is to say, an overall attenuation distribution trend of various curves in each of which the brightness of a respective type of R, G, B decreases respectively with the increase in the viewing angle may no longer be that as expected. FIG. 3 illustrates various curves in each of which a brightness of respective color of the display panel decreases with a variation of a viewing angle, where a horizontal axis thereof indicates the viewing angle with an angular unit (degree, i.e., °) and as illustrated in FIG. 3, the horizontal axis schematically shows that the viewing angle ranges between 0° and ±70°; and a vertical axis thereof refers to a brightness attenuation proportion with a unit of percentage (%). As illustrated, a solid line for the R sub-pixels (which is indicated by R (W/O)) is a curve in which the brightness of the R sub-pixels decreases before any improvement in color deviation or color offset, and it can be seen therefrom that the brightness of the R sub-pixels decreases with an increase in the viewing angle at a proportion significantly lower than a proportion at which the brightness of each type of the G sub-pixels and the B sub-pixels decreases with an increase in the viewing angle. Therefore, in a condition that the viewing angle deviates from 0°, white light has an obvious color deviation or color offset.

Figure 4:
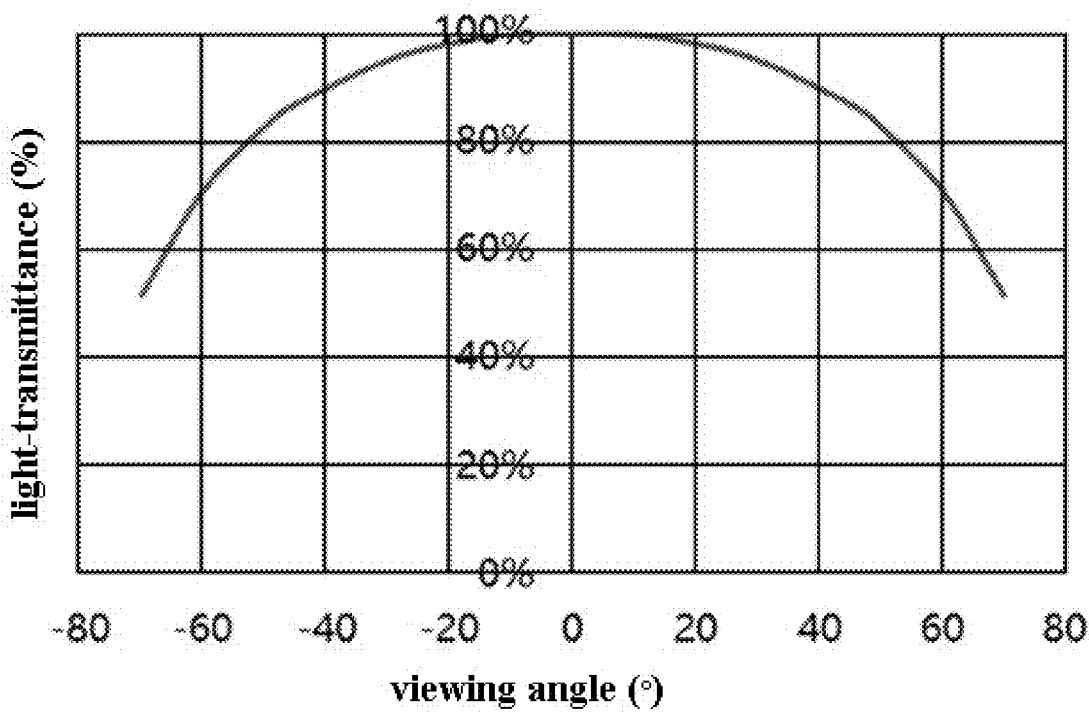
FIG. 4 illustrates a curve of a light-transmittance of light rays passing through the polarizing component according to embodiments of the disclosure.

Based on the optical effect of the polarizing component 100, the polarizing component 100 as above may be applied to the display panel. Since the linearly polarized light L2*a* incident in a direction other than the direction of the optical axis of the phase delay portion 132 passes through the phase delay portion 132 and is then decomposed into at least two types of polarized light in different directions (i.e., polarized light L2*a*1 and polarized light L2*a*2), and the second polarizer 120 absorbs other polarized light exiting the phase delay portion 132 and having polarization direction(s) different from the polarization direction a of the linearly polarized light L2*a*, therefore, the light-transmittance of light rays may vary at different viewing angles. FIG. 4 illustrates a graph of relation of the light-transmittance of light rays passing through the polarizing component according to embodiments of the disclosure. A horizontal axis thereof indicates the viewing angle with an angular unit (degree, i.e., °), and it shows that the viewing angle has its value ranging between 0° and ±70°; and a vertical axis thereof refers to the light-transmittance with a unit of percentage (%). Specific data information of the curve as illustrated in FIG. 4 are shown in Table 1 as below.

TABLE 1

| Viewing angle (°) | light-transmittance |
|---|---|
| 0 | 100.0% |
| ±10 | 99.5% |
| ±20 | 97.8% |
| ±30 | 94.8% |
| ±45 | 86.7% |
| ±50 | 82.5% |
| ±60 | 70.8% |
| ±70 | 51.5% |

It can be seen from FIG. 4 and Table 1 that, the larger the viewing angle of the incident light is, the greater a loss of intensity of light after passing through the polarizing component 100 is, i.e., the lower the light-transmittance is. It should be noted that, contents as shown in FIG. 4 and Table 1 may merely be schematic illustrations of the light-transmittance of the incident light passing through the polarizing component 100 at different viewing angles. Light-transmittance at different viewing angles is not limited in embodiments of the disclosure, and is adjustable by changing the thickness and specific material of the phase delay portion 132. In practical application, by way of example, the polarizing component 100 is applied to the display panel comprising R, G, B sub-pixels, and since after the linearly polarized light which is incident on and enters the phase delay portion 132 in a direction other than the direction of the optical axis of the phase delay portion 132 sequentially passes through both the phase delay portion 132 and the second polarizer 120, its brightness will be significantly declined, with a proportion of decline of the brightness varying at different viewing angles, then, the light-transmittance are illustrated by referring to FIG. 4 and Table 1. Therefore, the phase delay portion 132 of the polarizing component 100 may be provided in a region where light exits the R sub-pixels, and then the Luminance Decay Curve of the R sub-pixels is shown as a dotted line for the R sub-pixels as illustrated in FIG. 3 (which is indicated by R (W)); and by comparing the dotted line for the R sub-pixels with the solid line for the R sub-pixels, it can be seen that, a speed at which the brightness of the R sub-pixels attenuates with an increase in the viewing angle may be accelerated, by providing the phase delay portion 132 at the light-emergent side of the R sub-pixels, and the proportion of the brightness of the R sub-pixels attenuating with the increase in the viewing angle after such improvement is closer to the proportion of the brightness of each type of the G sub-pixels and the B sub-pixels attenuating with the increase in the viewing angle, i.e., improving the Luminance Decay Curve of monochromatic light, so as to flexibly balance a ratio among R, G, B monochromatic light components, facilitating achieving an effect of solving a problem of color deviation or color offset of the display panel.

In the polarizing component 100 according to embodiments of the present disclosure, the first polarizer 110 provided at the light-incident side may change a polarized light incident thereon into a first linearly polarized light emergent therefrom in respective specified polarization direction, and the second polarizer 120 provided at the light-emergent side may change a polarized light incident thereon into a second linearly polarized light emergent therefrom in respective specified polarization direction. The phase delay portion 132 of the wave plate layer 130 interposed between the first polarizer 110 and the second polarizer 120 may implement a phase delay onto the linearly polarized light which is incident thereon in a direction different from the direction of the optical axis of the phase delay portion 132 in such a way that the polarized light which exits the phase delay portion comprises the first polarized light in the first polarization direction and the second polarized light in the second polarization direction (the first linearly polarized light and the second linearly polarized light form collectively an elliptically polarized light or a circularly polarized light). In addition, the light transmission portion 131 of the wave plate layer 130 may transmit light which is incident on and enters the light transmission portion. Based on both hardware structure and optical effect of the polarizing component 100, after the linearly polarized light which passes through the light transmission portion exits the second polarizer 120, its brightness is almost unchanged; and after the linearly polarized light which is incident on the phase delay portion 132 then passes through the phase delay portion 132 and the second polarizer 120 sequentially and forms a linearly polarized light exiting the second polarizer 120, its brightness decreases. The polarizing component 100 according to embodiments of the present disclosure is applied to the display panel, and can be used for providing the phase delay portion 132 at the light-emergent side of sub-pixels of a specific color, wherein the brightness of the sub-pixels of the specific color may attenuate with an increase in the viewing angle at a speed lower than a speed as expected; as such, a practical speed at which the brightness of light which exits the sub-pixels of the specific color above all and then exits the polarizing component 100 attenuates with the increase in the viewing angle is accelerated so as to be consistent with the speed as expected. By above settings, the speed at which the brightness of the sub-pixels of the specific color attenuates with the increase in the viewing angle may be accelerated, and the Ratio among R, G, B monochromatic light components in displayed pictures may be balanced flexibly, without influencing the front efficiency, the cathode resistance, and the color gamut of the displayed pictures of the OLED panel, thus solving the problem of color deviation or color offset of the relevant display panel at different viewing angles.

In embodiments of the disclosure, by taking into consideration that two functional regions contained in the wave plate layer 130, i.e., the light transmission portion 131 and the phase delay portion 132, may achieve different optical effects, then, these two functional regions in the wave plate layer 130 may be realized in different ways.

In one embodiment of the present disclosure, two different diaphragms or membranes may be used to form the wave plate layer 130 collectively, for example, the light transmission portion 131 is formed by a light-transmitting substrate and the phase delay portion 132 is formed by a quarter wave plate which may be prepared by a polymer material. Since the polarizing component 100 according to embodiments of the disclosure is typically applied to the display panel, it is used for solving the problem of color deviation or color offset due to that the brightness of the sub-pixels of the specific color attenuates with the increase in the viewing angle at a relatively low speed. Therefore, the quarter wave plate (i.e., functioning as the phase delay portion 132) may be provided to space apart between adjacent light-transmitting substrate (i.e., the light transmission portion 131). In some embodiments, the light transmission portion 131 is arranged in an array and the phase delay portion 132 is also arranged in an array, and the light transmission portion 131 and the phase delay portion 132 are provided to be staggered with each other.

In another embodiment of the present disclosure, an entirety of the wave plate layer 130 may comprise a cross-linked azobenzene polymer film layer, and the phase delay portion 132 may be a patterned region in the cross-linked azobenzene polymer film layer, which patterned region is in a form of crystallization after being irradiated by a linearly polarized light (for example a ultraviolet polarized light).

Figure 5:
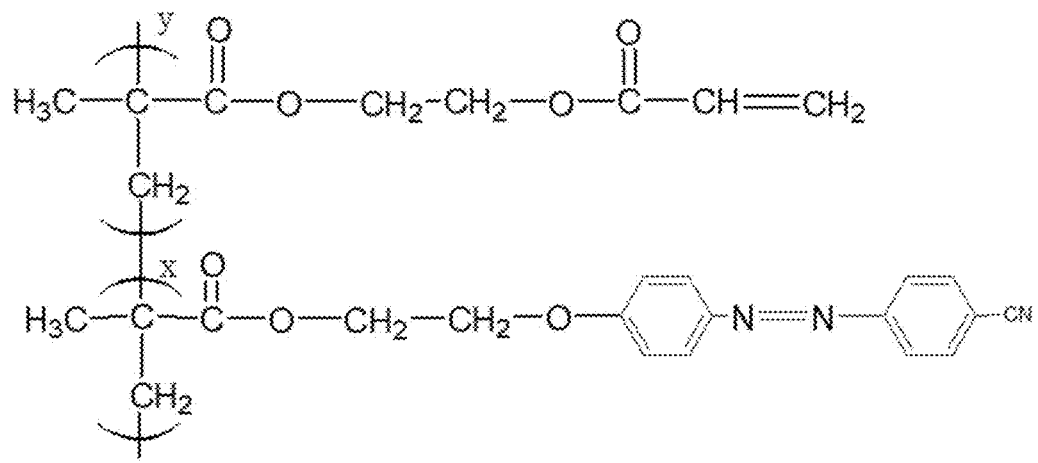
FIG. 5 illustrates a schematic view of a chemical structure of a cross-linked azobenzene polymer.

The cross-linked azobenzene polymer is a new type of optical storage material. FIG. 5 exemplarily illustrates a schematic view of a chemical structure of a cross-linked azobenzene polymer. Other regions of the cross-linked azobenzene polymer film layer which are not irradiated by the ultraviolet polarized light typically have optical transparency; however, when a linearly polarized light (e.g., ultraviolet polarized light) is used for irradiation, then, in a direction perpendicular to the polarization direction of the polarized light, molecules inside the material undergo a cis-trans isomerization and are re-orientated, resulting in changes in morphology, structure and refractive index, and exhibiting anisotropy externally. Both photo stability and thermal stability of the material may be enhanced by introducing free radicals into the material to cause the molecules of the material to cross-link with each other or one another, and the cross-linked azobenzene polymer film layer having a disordered distribution of the molecules may be prepared by spin coating. Then, the cross-linked azobenzene polymer film layer is irradiated at specific position(s) thereof by the ultraviolet linearly polarized light, so as to form the patterned region in a form of crystallization, which is also referred to as a pattern portion of the cross-linked azobenzene polymer film layer. As such, the pattern portion of the cross-linked azobenzene polymer film layer (i.e., functioning as the phase delay portion 132) has a functionality of the phase delay portion. The phase delay portion may be considered equivalent to the quarter wave plate. And other regions of the cross-linked azobenzene polymer film layer which are not irradiated by the ultraviolet polarized light function as the light transmission portion 131 in the wave plate layer 130 because they still possess optical transparency. For example, the cross-linked azobenzene polymer film layer may have a thickness ranging between 0.5 μm and 10 μm.

It should be noted that, embodiments of the present disclosure are not limited to the formation of the wave plate layer 130 by using cross-linked azobenzene polymer. A use of cross-linked azobenzene polymer as the wave plate layer 130 is merely a schematic illustration of embodiments of the present disclosure, and the wave plate layer 130 may also be formed by using a material having the same or similar properties as cross-linked azobenzene polymer.

Based on the polarizing component 100 according to embodiments of the present disclosure, a display panel is further provided in embodiments of the present disclosure.

Figure 6:
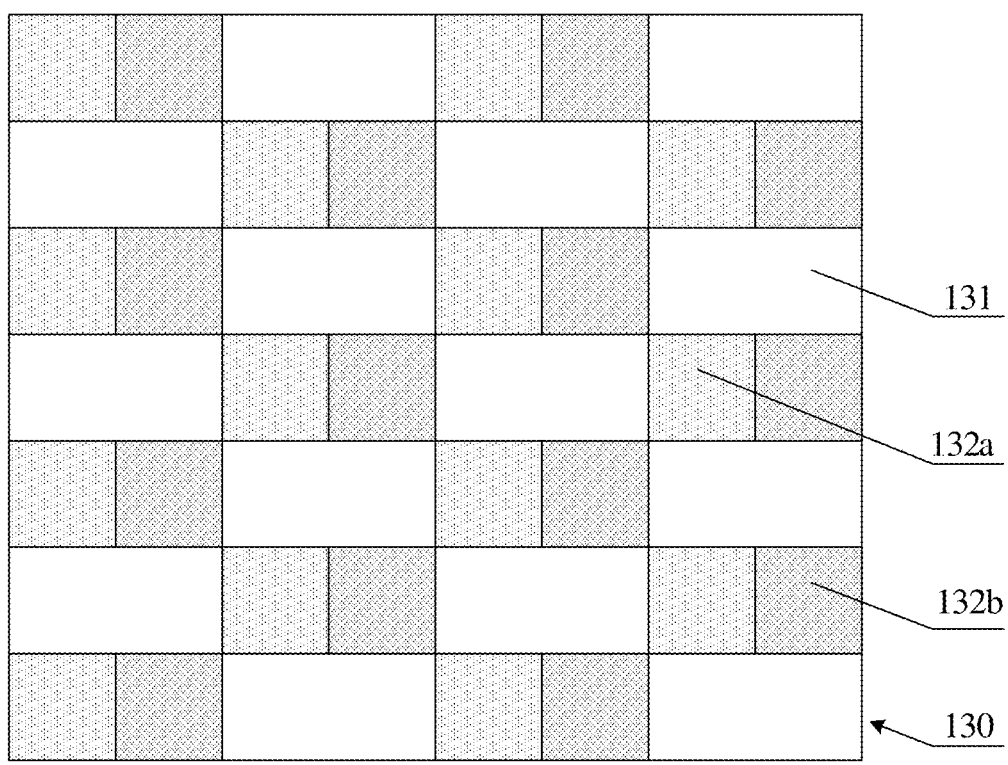
FIG. 6 illustrates a schematic structural view of a wave plate layer in the polarizing component according to embodiments of the disclosure.

FIG. 6 illustrates a schematic structural view of a wave plate layer in the polarizing component according to embodiments of the disclosure. The phase delay portion 132 in the wave plate layer 130 according to embodiments of the present disclosure may comprise a plurality of first units 132a arranged in an array in the wave plate layer 130, and the plurality of first units 132a are arranged at a light-emergent side of the plurality of first sub-pixels in the display panel, in one-to-one correspondence with the plurality of first sub-pixels, respectively. The term "correspondence" used herein means that orthogonal projections of the plurality of first units 132a on a surface of the display panel at the light-emergent side thereof at least partially overlap with regions on the surface of the display panel at the light-emergent side thereof which are occupied by the plurality of first sub-pixels (by way of example, orthogonal projections of the plurality of first units 132a on a surface of the display panel at the light-emergent side thereof completely overlap with regions on the surface of the display panel at the light-emergent side thereof which are occupied by the plurality of first sub-pixels, and in such a condition, the term "correspondence" means that they are fully aligned with each other).

The plurality of first units 132a in embodiments of the present disclosure are configured to implement a first phase delay onto the linearly polarized light incident thereon, such that the first polarized light exiting the plurality of first units 132a has the first light intensity and the second polarized light exiting the plurality of first units 132a has the second light intensity; and the first light intensity and the second light intensity are superposed to be a light intensity of the linearly polarized light which is incident on and enters the plurality of first units 132a (i.e., a light intensity of the elliptically polarized light or the circularly polarized light which is formed by superposing the first linearly polarized light and the second linearly polarized light both of which are converted by the plurality of first units 132a from the linearly polarized light incident thereon).

Furthermore, the phase delay portion 132 may further comprise a plurality of second units 132b arranged in an array in the wave plate layer 130, and the plurality of second units 132b are arranged at a light-emergent side of the plurality of second sub-pixels in the display panel, in one-to-one correspondence with the plurality of second sub-pixels, respectively. The term "correspondence" used herein means that orthogonal projections of the plurality of second units 132b on a surface of the display panel at the light-emergent side thereof at least partially overlap with regions on the surface of the display panel at the light-emergent side thereof which are occupied by the plurality of second sub-pixels (by way of example, orthogonal projections of the plurality of second units 132b on a surface of the display panel at the light-emergent side thereof completely overlap with regions on the surface of the display panel at the light-emergent side thereof which are occupied by the plurality of second sub-pixels, and in such a condition, the term "correspondence" means that they are fully aligned with each other). In some embodiments, the plurality of second sub-pixels and the plurality of first sub-pixels are essentially two types of sub-pixels having respective colors different from each other. And in some embodiments, monochromatic light exiting all of the plurality of first sub-pixels in the display panel has one and the same color, while monochromatic light exiting all of the plurality of second sub-pixels in the display panel also has one and the same color, and the monochromatic light exiting all of the plurality of first sub-pixels and the monochromatic light exiting all of the plurality of second sub-pixels differ from each other in respective colors.

The plurality of second units 132b in embodiments of the present disclosure are configured to implement a second phase delay onto the linearly polarized light incident thereon, such that a third polarized light exiting the plurality of first units 132b has a third light intensity and a fourth polarized light exiting the plurality of second units 132b has a fourth light intensity; and the third light intensity and the fourth light intensity are superposed to be a light intensity of the linearly polarized light which is incident on and enters the plurality of second units 132b (i.e., a light intensity of the elliptically polarized light or the circularly polarized light which is formed by superposing the third linearly polarized light and the fourth linearly polarized light both of which are converted by the plurality of second units 132b from the linearly polarized light incident thereon). In some embodiments, the fourth light intensity is different from the second light intensity.

Based on specific settings of the sub-pixels in the display panel, the polarizing component 100 may adjust the speed at which the brightness of the sub-pixels of one or more colors attenuates. By way of example, the plurality of second units 132b may be arranged in an array in the wave plate layer 130. In some embodiments, the polarizing component 100 may adjust the speed at which the brightness of the R sub-pixels within the R, G, and B sub-pixels attenuates. That is to say, in a condition that sub-pixels of merely one color (e.g., the plurality of first sub-pixels, for example the R sub-pixels) have their brightness attenuating at a speed significantly lower than respective speed(s) at which respective brightness of sub-pixels of other colors attenuate, in a display panel in which the color deviation or color offset exists, then, the phase delay portion 132 may merely comprise the plurality of first units 132a configured to accelerate the speed at which the brightness of the R sub-pixels attenuates. This may for example be achieved, specifically by arranging the polarizing component 100 against the surface of the plurality of R sub-pixels on the light-emergent side thereof (i.e., by providing the first polarizer 110 of the polarizing component 100 to abut against the surface of the plurality of R sub-pixels on the light-emergent side thereof); as such, the linearly polarized light which is formed by light exiting the R sub-pixels passing through both the R sub-pixels and the first polarizer 110 provided to abut against the R sub-pixels, is incident on and enters the plurality of first units 132a. And the plurality of first units 132a functioning as the phase delay portion 132 implement the first phase delay onto the linearly polarized light incident thereon, such that in the polarized light exiting the plurality of first units 132a, the first polarized light has the first light intensity and the second polarized light has the second light intensity; and the first light intensity and the second light intensity are superposed to be a light intensity of the linearly polarized light which is incident on and enters the plurality of first units 132a (i.e., the light intensity of the elliptically polarized light or the circularly polarized light which is formed as an emergent polarized light by superposing the first linearly polarized light and the second linearly polarized light both of which are converted by the plurality of first units 132a from the linearly polarized light incident thereon). After the polarized light exiting the plurality of first units passes through the second polarizer 120, it exits the second polarizer 120 to become a linearly polarized light in a specified direction, i.e., the second polarizer 120 may absorb polarized light whose polarization direction is different from the direction of the light transmission axis of the second polarizer 120, in the light exiting the plurality of first units. Therefore, the light intensity of the linearly polarized light exiting the second polarizer 120 is less than that of the linearly polarized light which is incident on and enters the plurality of first unit 132a.

In an application scenario of embodiments of the present disclosure, it is assumed that the display panel comprises sub-pixels of various colors, such as P1 type, P2 type, P3 type and P4 type sub-pixels (i.e., four types of sub-pixels labeled by P1, P2, P3 and P4 respectively), which are configured to emit monochromatic light of different colors. It is set that the P1 type sub-pixels may have own brightness attenuating at a speed which is lowest (i.e., the brightness of the P1 type sub-pixels has a lowest attenuation speed), the P2 type sub-pixels may have own brightness attenuating at a speed which is larger than that at which the brightness of the P1 type sub-pixels attenuates but is significantly less than that at which the brightness of each type of the P3 type sub-pixels and the P4 type sub-pixels attenuates (i.e., the brightness of the P2 type sub-pixels has its attenuation speed which is greater than that of the P1 type sub-pixels but is significantly less than that of each type of the P3 type sub-pixels and the P4 type sub-pixels). As to the display panel, the attenuation speed of the brightness of the P1 type sub-pixels and the attenuation speed of the brightness of the P2 type sub-pixels may be adjusted simultaneously. In such a condition, by way of example, the P1 type sub-pixels function as the plurality of first sub-pixels and the P2 type sub-pixels function as the plurality of second sub-pixels, respectively, then, the polarizing component may be provided for them. The first phase delay applied by a respective portion of the phase delay portion corresponding to the P1 type sub-pixels may be set for the linearly polarized light which is formed by the light exiting the P1 type sub-pixels and then passing through the first polarizer of the polarizing component, and the second phase delay applied by a respective portion of the phase delay portion corresponding to the P2 type sub-pixels in the polarizing component may be set for the linearly polarized light which is formed by the light exiting the P2 type sub-pixels and then passing through the first polarizer of the polarizing component, respectively; and the first light intensity of the first polarized light and the second light intensity of the second polarized light are set respectively for the P1 type sub-pixels (both the first polarized light and the second polarized light exit respective portion of the phase delay portion corresponding to the P1 type sub-pixels), and the third light intensity of the third polarized light and the fourth light intensity of the fourth polarized light are set respectively for the P2 type sub-pixels (both the third polarized light and the fourth polarized light exit respective portion of the phase delay portion corresponding to the P2 type sub-pixels). Specifically, by providing the plurality of first units 132a on the light-emergent side of the P1 type sub-pixels to function as the respective portion of the phase delay portion corresponding to the P1 type sub-pixels (the phrase "corresponding to" used herein means that orthogonal projections of the plurality of first units 132a on the surface of the display panel at the light-emergent side thereof at least partially overlap with, for example completely overlap with, regions on the surface of the display panel at the light-emergent side thereof which are occupied by the plurality of P1 type sub-pixels; and by way of example, in such a condition that they completely overlap with each other, the phrase "corresponding to" means that they are fully aligned with each other), and providing the plurality of second units 132b on the light-emergent side of the P2 type sub-pixels to function as the respective portion of the phase delay portion corresponding to the P2 type sub-pixels (the phrase "corresponding to" used herein means that orthogonal projections of the plurality of second units 132b on the surface of the display panel at the light-emergent side thereof at least partially overlap with, for example completely overlap with, regions on the surface of the display panel at the light-emergent side thereof which are occupied by the plurality of P2 type sub-pixels; and by way of example, in such a condition that they completely overlap with each other, the phrase "corresponding to" means that they are fully aligned with each other), and by setting the first phase delay of the linearly polarized light which is incident on and enters the plurality of first units 132a, the first light intensity of the first polarized light exiting the plurality of first units 132a and the second light intensity of the second polarized light exiting the plurality of first units 132a, and by setting the second phase delay of the linearly polarized light which is incident on and enters the plurality of second units 132b, the third light intensity of the third polarized light exiting the plurality of second units 132b and the fourth light intensity of the fourth polarized light exiting the plurality of second units 132b, then, a degree at which the brightness of the P1 type sub-pixels accelerates to attenuate is made larger than a degree at which the brightness of the P2 type sub-pixels accelerates to attenuate. After adjustment, respective attenuation speeds of the brightness of the P1 type sub-pixels, the brightness of the P2 type sub-pixels, the brightness of the P3 type sub-pixels, and the brightness of the P4 type sub-pixels may conform more to those as expected, so as to balance a ratio among monochromatic light components from the P1 type, the P2 type, the P3 type and the P4 type sub-pixels having respective colors different from one another, facilitating achieving an effect of solving a problem of color deviation or color offset of the display panel.

In practical application, in a condition that the phase delay portion 132 is a quarter wave plate, then an effect of phase delay at different degrees may be achieved by configuring respective materials and respective thicknesses of the plurality of first units 132a and the plurality of second units 132b. By way of example, in a condition that the wave plate layer 130 is a cross-linked azobenzene polymer film layer, irradiations of different light intensities (e.g., irradiation of ultraviolet polarized light having different light intensities) may be applied on different regions of the wave plate layer, for example, the region of the wave plate layer 130 corresponding to the P1 type sub-pixels may be subjected to an irradiation of relatively high intensity so as to form the plurality of first units 132a, and the region of the wave plate layer 130 corresponding to the P3 type sub-pixels may be subjected to an irradiation of relatively low intensity, such that effects of phase delay at different degrees may be realized. In embodiments of the disclosure, the thickness of the wave plate layer 130 may range between 0.5 and 10 um.

For example, in embodiments of the present disclosure, the optical axis of the phase delay portion 132 is perpendicular to the wave plate layer 130, at that time, the linearly polarized light which is incident on and enters the phase delay portion 132 at a vertical incidence angle exits the second polarizer 120, with a light intensity of the light originally incident; and the linearly polarized light which is incident on and enters the phase delay portion 132 at a non-vertical incident angle exits the second polarizer 120 to become a linearly polarized light having an unchanged polarization direction and a light intensity smaller than the light intensity of the light originally incident, due to the fact that the phase delay portion 132 has an effect of decomposing the polarization direction and implementing a phase delay.

It should be noted that, embodiments of the present disclosure do not limit the direction of the optical axis of the phase delay portion 132, and the direction of the optical axis of the phase delay portion 132 may also be other directions not perpendicular to the wave plate layer 130. At that time, the linearly polarized light which is incident on and enters the phase delay portion 132 in the direction of the optical axis of the phase delay portion 132 then exits the second polarizer 120, with the light intensity of the light originally incident; and the linearly polarized light which is incident on and enters the phase delay portion 132 in a direction other than the direction of the optical axis of the phase delay portion 132 then exits the second polarizer 120 to become a linearly polarized light having an unchanged polarization direction and a light intensity smaller than the light intensity of the light originally incident.

Figure 7:
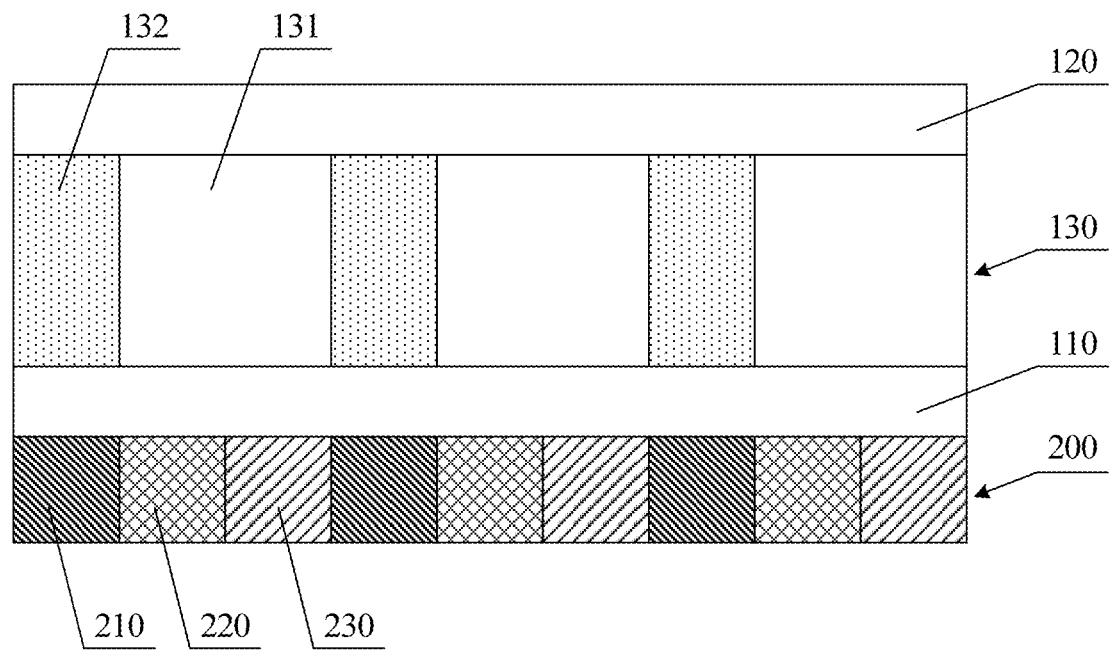
FIG. 7 illustrates a schematic structural view of a display panel according to embodiments of the disclosure.

As illustrated in FIG. 7, it shows a schematic structural view of a display panel according to embodiments of the disclosure, and the display panel according to embodiments of the present disclosure may comprise: a display component 200, and the polarizing component 100 which is located on a light-emergent side of the display components 200. The display component 200 is located on (e.g., by abutting against) a side of the polarizing component 100 proximal to the first polarizer 110 thereof.

The polarizing component 100 in embodiments of the present disclosure may be the polarizing component 100 in any of the embodiments of the present disclosure as illustrated in FIG. 1 to FIG. 6 as above.

The display components 200 in embodiments of the disclosure may comprise a plurality of first sub-pixels 210, a plurality of second sub-pixels 220 and a plurality of third sub-pixels 230 which are provided alternately with one another, the plurality of first sub-pixels 210 are configured to emit a first monochromatic light, the plurality of second sub-pixels 220 are configured to emit a second monochromatic light, and the plurality of third sub-pixels 230 are configured to emit a third monochromatic light.

A region of an orthogonal projection of the phase delay portion of the polarizing component 100 on a plane where the display components 200 are located (in this context, such a plane refers to a light-emergent surface of the display components) is located above and at least partially overlaps with the plurality of first sub-pixels 210. A proportion of the brightness of the first monochromatic light attenuating with the increase in the viewing angle is smaller than a proportion of the brightness of the second monochromatic light and a proportion of the brightness of the third monochromatic light attenuating with the increase in the viewing angle.

In embodiments of the present disclosure, the first polarizer 110, the wave plate layer 130 and the second polarizer 120 may be integrally aligned and bonded onto the display panel 200. Specific application scenario of embodiments of the present disclosure may refer to the display panel comprising R, G, B sub-pixels in aforementioned embodiments, a proportion of the brightness of red light emitted by the R sub-pixels attenuating with the increase in the viewing angle is significantly smaller than that of green light and that of blue light. Therefore, when the polarizing component 100 is bonded to the display panel 200, the phase delay portion 132 may be provided on the light-emergent side of the R sub-pixels. As such, the speed at which the brightness of the red light attenuating with the increase in the viewing angle may be accelerated, so as to balance the ratio among three color components of R, G, B in displayed pictures.

In embodiments of the present disclosure, in a condition that the phase delay portion 132 comprises the plurality of first units 132a and the plurality of second units 132b, a region of an orthogonal projection of the plurality of first units 132a on a plane where the display components 200 are located is arranged above the plurality of first sub-pixels, in one-to-one correspondence therewith (the term "correspondence" used herein means that orthogonal projections of the plurality of first units 132a on the surface of the display panel at the light-emergent side thereof at least partially overlap with, for example completely overlap with, regions on the surface of the display panel at the light-emergent side thereof which are occupied by the plurality of first sub-pixels; and by way of example, in such a condition that they completely overlap with each other, the term "correspondence" means that they are fully aligned with each other), and a region of an orthogonal projection of the plurality of second units 132b on the plane where the display components 200 are located is arranged above the plurality of second sub-pixels, in one-to-one correspondence therewith (the term "correspondence" used herein means that orthogonal projections of the plurality of second units 132b on the surface of the display panel at the light-emergent side thereof at least partially overlap with, for example completely overlap with, regions on the surface of the display panel at the light-emergent side thereof which are occupied by the plurality of second sub-pixels; and by way of example, in such a condition that they completely overlap with each other, the term "correspondence" means that they are fully aligned with each other). In some embodiments, orthogonal projections of the plurality of first sub-pixels 210 on the plane where the display components 200 are located fall within the orthogonal projections of the plurality of first units 132a on the plane where the display components 200 are located, and orthogonal projections of the plurality of second sub-pixels 220 on the plane where the display components 200 are located fall within the orthogonal projections of the plurality of second units 132b on the plane where the display components 200 are located. In embodiments of the disclosure, a proportion of the brightness of the first monochromatic light attenuating with the increase in the viewing angle is smaller than a proportion of the brightness of the second monochromatic light attenuating with the increase in the viewing angle, and the proportion of the brightness of the second monochromatic light attenuating with the increase in the viewing angle is in turn smaller than a proportion of the brightness of the third monochromatic light attenuating with the increase in the viewing angle. Therefore, by providing the phase delay portion 132 which comprises the plurality of first unit 132a and the plurality of second units 132b, the ratio among various monochromes of R, G, B in displayed pictures is balanced.

The application scenario of embodiments of the present disclosure may also refer to the display panel comprising the P1 type, the P2 type, the P3 type and the P4 type sub-pixels in the above embodiments. The brightness of the P1 type sub-pixels has a lowest attenuation speed, the brightness of the P2 type sub-pixels has its attenuation speed which is greater than that of the P1 type sub-pixels but is significantly less than that of each type of the P3 type sub-pixels and the P4 type sub-pixels. Therefore, when the polarizing component 100 is bonded to the display panel 200, the plurality of first unit 132a whose brightness attenuates at a relatively large degree may be provided on the light-emergent side of the P1 type sub-pixels, and the plurality of second unit 132b whose brightness attenuates at a relatively small degree may be provided on the light-emergent side of the P2 type sub-pixels; as such, the speed at which the brightness of the first monochromatic light attenuates with the increase in the viewing angle and the speed at which the brightness of the second monochromatic light attenuates with the increase in the viewing angle may be accelerated, such that respective attenuation speeds of the brightness of the P1 type sub-pixels, the brightness of the P2 type sub-pixels, the brightness of the P3 type sub-pixels, and the brightness of the P4 type sub-pixels may conform more to those as expected, so as to balance the ratio among monochromatic light components of different colors in displayed pictures. It should be noted that, the technical solution may also be extended to a condition in which the phase delay portion 132 comprises more units having different capabilities of adjusting brightness, so as to adjust properties of respective brightness of more types of sub-pixels changing within a variation in the viewing angle.

It should be noted that in some embodiments, a cross-linked azobenzene polymer film layer is used to function as the wave plate layer 130 in the polarizing component 100. In this case, a specific pixel position in the cross-linked azobenzene polymer film layer corresponding to the display component has already been subjected to a cis-trans isomerization, i.e., the specific pixel position has the characteristics of a quarter wave plate, and is essentially a position where the phase delay portion 132 is located. In some embodiments, different positions in the cross-linked azobenzene polymer film layer may be processed differently (for example, be subjected to irradiations of ultraviolet polarized light having different light intensities, respectively), so as to form different functional units, such as the plurality of first units 132a and the plurality of second units 132b, and the like.

In embodiments of the present disclosure, the display components 200 may be OLED devices. The OLED devices comprise light-emitting units, and the phase delay portion 132 may at least be located in a light-emergent region of light-emitting units for emitting the first monochromatic light.

The OLED devices are devices that enable an organic material to emit light under the action of an electric field, and have some characteristics such as relatively high contrast, ultra-slim flexibility which is realizable, and short response time and the like. An OLED panel has been widely used in the display technologies. In the OLED panel, OLED devices may have a layered structure which may comprise: an anode, an organic functional layer, a cathode, and a thin film encapsulation (TFE), and the like. The organic functional layer may comprise an electron transfer layer, an organic light-emitting layer and a hole transport layer. In some embodiments, the OLED devices are in the form of a top emission structure. By way of example, the anode is in the form of a total reflection structure, the cathode is in the form of a semi-reflection structure, and the cathode is provided adjacent to the position of the first polarizer 110.

The display panel according to embodiments of the present disclosure may improve the micro-cavity effect and color deviation of the OLED panel by providing the polarizing component 100 according to embodiments of the present disclosure on the light-emergent side of the OLED devices. By using the quarter wave plate or a patterned portion of the cross-linked azobenzene polymer film layer to adjust the micro-cavity effect of sub-pixels of different colors, the Luminance Decay Curve of monochromatic light may be improved (as illustrated in FIG. 3), without influencing the front efficiency, the cathode resistance and the color gamut of displayed pictures of an OLED panel, so as to flexibly balance the ratio among monochromatic light components in displayed pictures, thus solving the problem of color deviation or color offset of the relevant display panel at different viewing angles.

Figure 8:
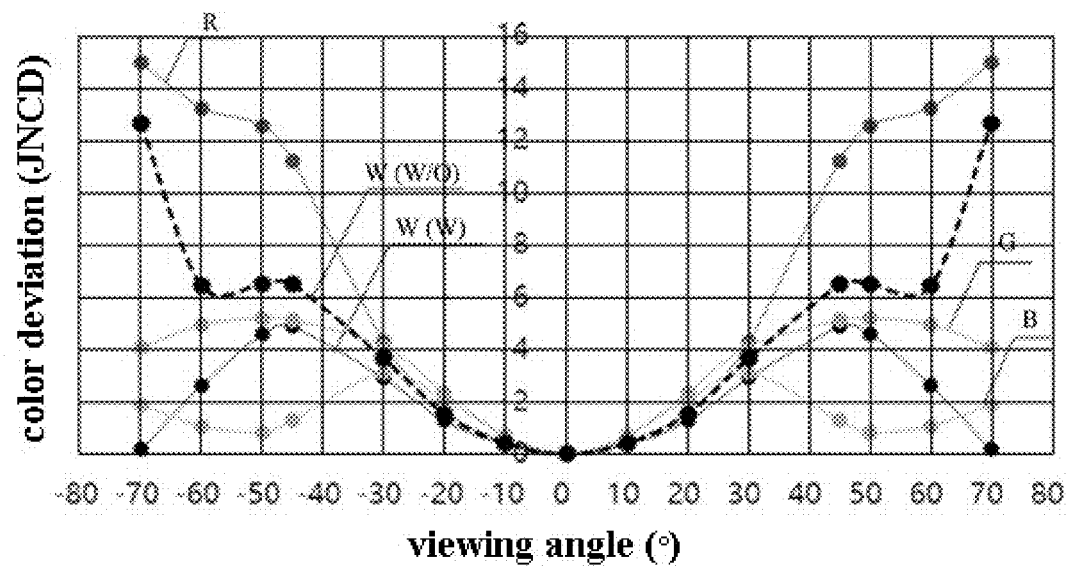
FIG. 8 illustrates a curve of color deviation of the display panel according to embodiments of the disclosure.

FIG. 8 illustrates a curve of color deviation of the display panel according to embodiments of the disclosure. By way of example, a condition in which the display panel is an OLED panel and the display components comprise R, G, B sub-pixels is taken as an example. A horizontal axis of the curve indicates the viewing angle with an angular unit (degree, i.e., °) and as illustrated, the horizontal axis schematically shows that the viewing angle ranges between 0° and ±80°; and a vertical axis of the curve refers to a Just Noticed Color Difference (which may be abbreviated as color deviation or JNCD). A dotted line W(W/O) represents a curve of color deviation of white pictures without adding the polarizing component 100, and a solid line W(W) represents a curve of color deviation of white pictures having added the polarizing component 100. As shown in Table 2 and Table 3 as below, Table 2 shows values of brightness of R, G, B, W sub-pixels in a condition that the OLED device without the polarizing component 100 (expressed by W/O), and Table 3 shows values of brightness of R, G, B, W sub-pixels in a condition that the OLED device having added the polarizing component 100 (expressed by 'With').

TABLE 2

| | W/O | | | | | |
|---|---|---|---|---|---|---|
| | R | | | G | | |
| Viewing angle(°) | Brightness value | X | Y | Brightness value | x | y |
| 0 | 94.1 | 0.6668 | 0.3330 | 233.5 | 0.2339 | 0.7106 |
| ±10 | 95.0 | 0.6657 | 0.3340 | 227.4 | 0.2274 | 0.7133 |
| ±20 | 95.8 | 0.6633 | 0.3364 | 207.5 | 0.2107 | 0.7179 |
| ±30 | 92.9 | 0.6575 | 0.3422 | 170.6 | 0.1919 | 0.7153 |
| ±45 | 68.3 | 0.6415 | 0.3581 | 101.3 | 0.1811 | 0.6967 |
| ±50 | 57.3 | 0.6383 | 0.3613 | 82.6 | 0.1805 | 0.6934 |
| ±60 | 40.2 | 0.6366 | 0.3630 | 52.7 | 0.1836 | 0.6844 |
| ±70 | 27.9 | 0.6323 | 0.3671 | 24.4 | 0.1948 | 0.6750 |

| | W/O | | | | | | |
|---|---|---|---|---|---|---|---|
| | B | | | W | | | |
| Viewing angle(°) | Brightness value | X | Y | Brightness value | x | y | JNCD |
| 0 | 22.4 | 0.1419 | 0.0433 | 350.0 | 0.3000 | 0.3100 | 0.0 |
| ±10 | 21.1 | 0.1426 | 0.0423 | 344.3 | 0.3021 | 0.3123 | 0.4 |
| ±20 | 17.8 | 0.1440 | 0.0404 | 324.5 | 0.3082 | 0.3182 | 1.5 |
| ±30 | 13.5 | 0.1455 | 0.0391 | 283.8 | 0.3197 | 0.3284 | 3.7 |
| ±45 | 7.9 | 0.1450 | 0.0424 | 188.6 | 0.3319 | 0.3509 | 6.5 |
| ±50 | 6.7 | 0.1442 | 0.0441 | 159.1 | 0.3302 | 0.3550 | 6.5 |
| ±60 | 4.9 | 0.1440 | 0.0449 | 112.9 | 0.3278 | 0.3549 | 6.4 |
| ±70 | 2.7 | 0.1444 | 0.0464 | 70.3 | 0.3519 | 0.3641 | 12.7 |

TABLE 3

| | With | | | | | |
|---|---|---|---|---|---|---|
| | R | | | G | | |
| Viewing angle(°) | Brightness value | X | Y | Brightness value | x | y |
| 0 | 94.1 | 0.6668 | 0.3330 | 233.5 | 0.2339 | 0.7106 |
| ±10 | 94.5 | 0.6657 | 0.3340 | 227.4 | 0.2274 | 0.7133 |
| ±20 | 93.7 | 0.6633 | 0.3364 | 207.5 | 0.2107 | 0.7179 |
| ±30 | 88.1 | 0.6575 | 0.3422 | 170.6 | 0.1919 | 0.7153 |
| ±45 | 59.2 | 0.6415 | 0.3581 | 101.3 | 0.1811 | 0.6967 |
| ±50 | 47.3 | 0.6383 | 0.3613 | 82.6 | 0.1805 | 0.6934 |
| ±60 | 28.5 | 0.6366 | 0.3630 | 52.7 | 0.1836 | 0.6844 |
| ±70 | 14.4 | 0.6323 | 0.3671 | 24.4 | 0.1948 | 0.6750 |

| | W/O | | | | | | |
|---|---|---|---|---|---|---|---|
| | B | | | W | | | |
| Viewing angle(°) | Brightness value | X | Y | Brightness value | x | y | JNCD |
| 0 | 22.4 | 0.1419 | 0.0433 | 350.0 | 0.3000 | 0.3100 | 0.0 |
| ±10 | 21.1 | 0.1426 | 0.0423 | 342.9 | 0.3017 | 0.3118 | 0.4 |
| ±20 | 17.8 | 0.1440 | 0.0404 | 319.0 | 0.3065 | 0.3162 | 1.3 |
| ±30 | 13.5 | 0.1455 | 0.0391 | 272.1 | 0.3155 | 0.3238 | 2.9 |
| ±45 | 7.9 | 0.1450 | 0.0424 | 168.3 | 0.3210 | 0.3393 | 4.8 |
| ±50 | 6.7 | 0.1442 | 0.0441 | 136.6 | 0.3157 | 0.3394 | 4.6 |
| ±60 | 4.9 | 0.1440 | 0.0449 | 86.0 | 0.3021 | 0.3262 | 2.6 |
| ±70 | 2.7 | 0.1444 | 0.0464 | 41.5 | 0.3010 | 0.3104 | 0.2 |

In Table 2 and Table 3, x and y in R, G, B, W sub-pixels are color coordinates of various colors. Referring to FIG. 3, FIG. 8, as well as Table 1 and Table 2, it can be seen that, with the increase in the viewing angle, W will seriously turn towards red, and the color coordinates of W may be shifted from (0.30, 0.31) when viewing angle is 0° to (0.35, 0.36) when the viewing angle is ±70°, and the color deviation is close to 13 JNCD. The reason lies in that, the brightness of the R sub-pixels attenuates at a much lower speed with the angle as compared with respective speeds at which the brightness of the G sub-pixels and the B sub-pixels attenuates respectively, rather than that the respective brightness of R, G, B sub-pixels attenuates approximately synchronously; then, by reducing the brightness of the R sub-pixels at various viewing angles, the shift of the W towards red color may be decreased, so as to balance the ratio among monochromatic light components in displayed pictures. Therefore, by bonding the wave plate 100 and placing the phase delay portion 132 at a light-emergent position of the R sub-pixels, the phase delay portion 132 may for example be the quarter wave plate in above embodiments or the cross-linked azobenzene polymer film layer having characteristics of a wave plate, the Luminance Decay Curve of the R sub-pixels may be improved. Once the wave plate layer 100 is added already, the color deviation of W is significantly decreased, with a maximal color deviation or color offset appearing at the viewing angle of ±45°, with a color deviation or color offset of merely 4.8 JNCD; at the same time, the color deviation is significantly reduced at relatively large viewing angles, with a color deviation or color offset being 0.2 JNCD at the viewing angle of ±45°.

In embodiments of the present disclosure, the display components may also be liquid crystal display (LCD) devices. In some embodiments, the LCD devices comprise a backlight source and a color film layer which has various filter units, and the phase delay portion 132 is at least located in the light-emergent region of the filter units for forming the first monochromatic light.

The polarizing component 100 according to above embodiments of the present disclosure may also be used to improve the color deviation of the LCD panel. That is to say, on the light-emergent side of the display components 200, the polarizing component 100 may specifically be bonded on the light-emergent side of the color film layer, and the effect of balancing the ratio among monochromatic light components in displayed pictures may also be realized, which solves the problem of color deviation of the relevant display panel at different viewing angles.

Although the embodiments disclosed in the present disclosure are as described above, they are merely provided to facilitate the understanding of the present disclosure, and are not intended to limit the present disclosure. Any modifications and variations may be made by those skilled in the art in terms of form and detail without departing from the spirit and scope of the present disclosure, but the scope of the present disclosure is defined by the appended claims.

What is claimed is:

1. A polarizing component, comprising:
a first polarizer provided on a light-incident side of the polarizing component, and configured to polarize a light incident thereon into a first linearly polarized light;
a wave plate layer on a surface of the first polarizer facing away from the light-incident side; and
a second polarizer provided on a surface of the wave plate layer facing away from the light-incident side, on a light-emergent side opposite to the light-incident side of the polarizing component, and configured to polarize a light incident thereon into a second linearly polarized light; and
wherein the wave plate layer comprises:
a phase delay portion configured to delay a phase of the first linearly polarized light which is incident thereon in a direction different from a direction of an optical axis of the phase delay portion in such a way that a polarized light which exits the phase delay portion comprises a first polarized light in a first polarization direction and a second polarized light in a second polarization direction, without incurring any phase delay of the first linearly polarized light which is incident on the phase delay portion in a direction consistent with the direction of the optical axis of the phase delay portion; and
a light transmission portion provided on a same layer as the phase delay portion, the light transmission portion being configured to transmit the first linearly polarized light which is incident thereon,
wherein the light transmission portion and the phase delay portion have an identical thickness, and together, side by side, form a single layer between the first polarizer and the second polarizer, and
wherein the wave plate layer comprises a cross-linked azobenzene polymer film layer, and the phase delay portion is a patterned region in the cross-linked azobenzene polymer film layer, which patterned region is in a crystallization form after having been irradiated by linearly polarized light.

2. The polarizing component according to claim 1, wherein the phase delay portion is a quarter wave plate.

3. The polarizing component according to claim 1, wherein the light transmission portion is arranged in an array, and the phase delay portion is also arranged in an array, and the light transmission portion and the phase delay portion are provided to be staggered with each other.

4. The polarizing component according to claim 1, wherein the first polarized light has a first light intensity, the second polarized light has a second light intensity, and the first light intensity and the second light intensity are superposed to be a light intensity of the first polarized light.

5. The polarizing component according to claim 1, wherein the optical axis of the phase delay portion is perpendicular to the wave plate layer.

6. The polarizing component according to claim 1, wherein the first polarized light and the second polarized light have one and the same polarization direction.

7. The polarizing component according to claim 1, wherein the polarized light which exits the phase delay portion comprises an elliptically polarized light or a circularly polarized light.

8. The polarizing component according to claim 1, wherein the wave plate layer has a thickness ranging between 0.5 μm and 10 μm.

9. The polarizing component according to claim 1, wherein the phase delay portion comprises at least a plurality of first units arranged in an array and a plurality of second units arranged in an array, the plurality of first units are configured to implement a first phase delay onto the linearly polarized light incident thereon and the plurality of second units are configured to implement a second phase delay onto the linearly polarized light incident thereon, respectively, and the first phase delay is different from the second phase delay.

10. A display panel, comprising:
display components, and
the polarizing component according to claim 1, which is located on a light-emergent side of the display components, the display components are located on a side of the polarizing component proximal to the first polarizer.

11. The display panel according to claim 10, wherein the display component comprises a plurality of first sub-pixels, light emitted by the plurality of first sub-pixels passing through the first polarizer to form the first linearly polarized light of the plurality of first sub-pixels;
the phase delay portion includes a plurality of first units located at a light-emergent side of the plurality of the first sub-pixels in the display panel, with orthogonal projections of the plurality of first units on a surface of the display panel at the light-emergent side thereof at least partially overlapping with regions on the surface of the display panel at the light emergent side thereof which are occupied by the plurality of first sub-pixels, and the plurality of first units are configured to implement a first phase delay onto the first linearly polarized light of the plurality of first sub-pixels which is incident thereon in a direction different from a direction of an optical axis of the plurality of first units.

12. The display panel according to claim 11, wherein the display component further comprises a plurality of second sub-pixels having a color different from that of the plurality of first sub-pixels, light emitted by the plurality of second sub-pixels passing through the first polarizer to form the first linearly polarized light of the plurality of second sub-pixels;

the phase delay portion further comprises a plurality of second units located at a light-emergent side of the plurality of the second sub-pixels in the display panel, with orthogonal projections of the plurality of second units on the surface of the display panel at the light-emergent side thereof at least partially overlapping with regions on the surface of the display panel at the light emergent side thereof which are occupied by the plurality of second sub-pixels, and the plurality of second units are configured to implement a second phase delay onto the first linearly polarized light of the plurality of second sub-pixels which is incident thereon in a direction different from a direction of an optical axis of the plurality of second units, with the second phase delay being different from the first phase delay.

13. The display panel according to claim 12, wherein orthogonal projections of the plurality of first sub-pixels on a plane where the display component is located falls within orthogonal projections of the plurality of first units on the plane where the display component is located, and orthogonal projections of the plurality of second sub-pixels on the plane where the display component is located falls within orthogonal projections of the plurality of second units on the plane where the display component is located.

14. The display panel according to claim 10, wherein the display component is an OLED device or an LCD device.

* * * * *